(12) United States Patent
Kang et al.

(10) Patent No.: US 12,002,708 B2
(45) Date of Patent: Jun. 4, 2024

(54) METHOD FOR FORMING INTERMETALLIC AIR GAP

(71) Applicants: SHANGHAI IC R&D CENTER CO., LTD., Shanghai (CN); Shanghai Integrated Circuit Equipment & Materials Industry Innovation Center Co., Ltd, Shanghai (CN)

(72) Inventors: Xiaoxu Kang, Shanghai (CN); Ruoxi Shen, Shanghai (CN); Xiaolan Zhong, Shanghai (CN)

(73) Assignees: SHANGHAI IC R&D CENTER CO., LTD., Shanghai (CN); SHANGHAI INTEGRATED CIRCUIT EQUIPMENT & MATERIALS INDUSTRY INNOVATION CENTER CO., LTD, Shanghai (CN)

( * ) Notice: Subject to any disclaimer, the term of this patent is extended or adjusted under 35 U.S.C. 154(b) by 409 days.

(21) Appl. No.: 17/613,491

(22) PCT Filed: Dec. 4, 2019

(86) PCT No.: PCT/CN2019/122974
§ 371 (c)(1),
(2) Date: Nov. 23, 2021

(87) PCT Pub. No.: WO2020/233095
PCT Pub. Date: Nov. 26, 2020

(65) Prior Publication Data
US 2022/0246466 A1 Aug. 4, 2022

(30) Foreign Application Priority Data
May 23, 2019 (CN) .......................... 201910433133.0

(51) Int. Cl.
*H01L 21/762* (2006.01)
*H01L 29/06* (2006.01)

(52) U.S. Cl.
CPC .... *H01L 21/76289* (2013.01); *H01L 29/0649* (2013.01)

(58) Field of Classification Search
CPC ........... H01L 21/02282; H01L 21/7682; H01L 29/0649; H01L 21/02112; H01L 21/76289;
(Continued)

(56) References Cited

U.S. PATENT DOCUMENTS 8,344,241 B1 * 1/2013 Vidu ............... H01L 31/022425
438/77
8,624,108 B1 * 1/2014 Dutta ............. H01L 31/035227
438/57
(Continued)

FOREIGN PATENT DOCUMENTS

CN 103094346 A 5/2013
WO 2018171399 A1 9/2018

*Primary Examiner* — Mouloucoulaye Inoussa
(74) *Attorney, Agent, or Firm* — Andrew C. Cheng

(57) ABSTRACT

The present invention discloses a method for forming an intermetallic air gap, which comprises following steps: S01: forming a trench in a solid dielectric; S02: preparing an insulating sheet-like two-dimensional material, wherein the insulating sheet-like two-dimensional material comprises an insulating nano sheet-like layer, the size of the insulating nano sheet-like layer in the sheet-like two-dimensional direction is greater than the size of the trench; S03: the insulating sheet-like two-dimensional material is deposited on the solid dielectric and the trench; S04: annealing the solid dielectric and the insulating sheet-like two-dimensional material to form a stable thin film composed of insulating sheet-like two-dimensional material on the trench. The method for forming an intermetallic air gap provided by (Continued)

the present disclosure can effectively increase the intermetallic air gap formation ratio, and greatly reduce the effective dielectric constant and interconnection delay, further reduce costs, and improve product performance.

10 Claims, 4 Drawing Sheets

(58) Field of Classification Search
CPC ............ H01L 29/66666; H01L 21/764; H01L 21/76264; H01L 27/088; H01L 21/76802; H01L 29/7827; H01L 29/0847; H01L 29/0653; H01L 29/4991; H01L 21/823885; H01L 29/6653; H01L 21/823487; H01L 23/485; H01L 29/6656; H01L 21/823481; H01L 21/31116; H01L 21/283; H01L 21/288; H01L 21/32051; H01L 21/32; H01L 21/30604; H01L 29/0673; H01L 29/7839; H01L 29/775; H01L 29/7838; H01L 29/7391; H01L 2221/1047; G03F 7/0002; G03F 7/168; G01N 27/00; G01N 27/4146; G01N 33/5438; C09D 11/32; C09D 11/36; C09D 11/38; C09D 11/52; B41J 11/0015; B41M 5/0017; H01M 4/602; H01M 10/0585; H01M 4/8882; H01M 4/0409; H01M 10/0525; H01M 2300/0042; Y02P 70/50; Y02E 60/50; Y02E 60/10; C23C 16/0227; C23C 16/26; C23C 16/56; C23C 16/0236; B01D 69/12; B01D 71/0211; C01B 32/186
USPC ............ 216/56, 67, 22, 40, 24, 41; 257/240, 257/144, 77, 21.038, 27.111, 29.295; 521/61; 438/691, 105, 20; 427/508, 515; 428/447, 508, 515, 398, 293.7; 423/447.2, 447.3; 430/320
See application file for complete search history.

(56) References Cited

U.S. PATENT DOCUMENTS

| | | | | |
|---|---|---|---|---|
| 9,368,572 | B1* | 6/2016 | Cheng | H01L 29/66742 |
| 10,374,254 | B2* | 8/2019 | Van Berkel | H01M 50/446 |
| 10,429,342 | B2* | 10/2019 | Hoffman | G01N 27/4146 |
| 2003/0143398 | A1* | 7/2003 | Ohki | B82Y 10/00 |
| | | | | 423/447.2 |
| 2004/0171262 | A1* | 9/2004 | Takayama | H01L 27/1214 |
| | | | | 257/E29.295 |
| 2004/0191698 | A1* | 9/2004 | Yagi | B82Y 10/00 |
| | | | | 430/320 |
| 2005/0098205 | A1* | 5/2005 | Roscheisen | H10K 30/87 |
| | | | | 257/E31.032 |
| 2005/0127814 | A1* | 6/2005 | Deguchi | B82Y 10/00 |
| | | | | 313/495 |
| 2006/0276056 | A1* | 12/2006 | Ward | H01L 23/53276 |
| | | | | 257/E27.047 |
| 2008/0264482 | A1* | 10/2008 | Lee | B82Y 10/00 |
| | | | | 136/256 |
| 2010/0173267 | A1* | 7/2010 | Cao | A61K 8/35 |
| | | | | 433/228.1 |
| 2010/0301734 | A1* | 12/2010 | Suh | H01M 4/926 |
| | | | | 977/939 |
| 2011/0214709 | A1* | 9/2011 | Evelsizer | H01L 31/072 |
| | | | | 257/E31.124 |
| 2015/0191604 | A1* | 7/2015 | Lawless | C25D 11/24 |
| | | | | 252/502 |
| 2018/0342734 | A1* | 11/2018 | Smith | H01M 4/602 |
| 2020/0062600 | A1* | 2/2020 | Kidambi | C23C 16/0227 |
| 2020/0141931 | A1* | 5/2020 | Hoffman | G01N 27/4146 |
| 2020/0181695 | A1* | 6/2020 | van Rooyen | B01L 3/502761 |
| 2020/0395238 | A1* | 12/2020 | Cheng | H01L 29/66666 |
| 2021/0111349 | A1* | 4/2021 | Zheng | G01J 3/0294 |

\* cited by examiner

METHOD FOR FORMING INTERMETALLIC AIR GAP

CROSS-REFERENCE TO RELATED APPLICATION

This application claims priority of International Patent Application Serial No. PCT/CN2019/122974, filed Dec. 4, 2019, which is related to and claims priority of Chinese patent applications Serial No. 201910433133.0 filed on May 23, 2019. The entirety of each of the above-mentioned patent applications is hereby incorporated herein by reference and made a part of this specification.

TECHNICAL FIELD

The disclosure relates to the field of intermetallic air gaps, in particular to a method for forming intermetallic air gaps.

BACKGROUND

With the process development of Very Large Scale Integration (VLSI), the increase of chip speed, the reduction of power consumption and so on, the delay of metal interconnection lines has far exceeded the delay of devices. To reduce the interconnect delay, low dielectric constant materials need to be used. Since the relative node constant of the air is 1, the ultimate way to reduce the dielectric constant is to achieve an intermetallic air gap.

The intermetallic air gap interconnection technology scheme in prior art is to form a trench between metal interconnection lines by photolithography after the metal interconnection lines are formed, and then use non-conformal chemical vapor deposition (CVD) and other thin film forming techniques to deposit the dielectric thin film. The trench is sealed to form a sealed intermetallic air gap between the interconnection lines. The intermetallic air gap interconnection technology scheme in prior art has the following problems:
- ①, The processes are complex, additional patterning process and planarization process are required;
- ②, With the use of non-conformal CVD film formation technology, a large number of thin films are still deposited in the intermetallic air gap, resulting in the actual volume of the intermetallic air gap being reduced compared to the volume of the trench between the interconnection lines, and the effective dielectric constant will increase.

SUMMARY

The purpose of the present disclosure is to provide a method for forming an intermetallic air gap, which can effectively increase the forming ratio of the intermetallic air gap, thereby greatly reducing the effective dielectric constant and interconnection delay, further reducing costs, and improving product performance.

To achieve the above objective, the present disclosure adopts the following technical solution: a method for forming an intermetallic air gap includes the following steps:
  S01: forming a trench in a solid dielectric;
  S02: preparing an insulating sheet-like two-dimensional material, wherein the insulating sheet-like two-dimensional material comprises an insulating nano sheet-like layer, and the size of the insulating nano sheet-like layer in the sheet-like two-dimensional direction is larger than the size of the trench;
  S03: depositing the insulating sheet-shaped two-dimensional material on the solid dielectric and the trench;
  S04: annealing the solid dielectric and the insulating sheet-like two-dimensional material to form a stable insulating sheet-like two-dimensional material thin film, thereby forming an intermetallic air gap sealed by the insulating sheet-like two-dimensional material thin film.

Further, the step S02 further comprises: dissolving the insulating sheet-like two-dimensional material in water and adding an organic solvent to prepare an insulating sheet-shaped two-dimensional material solution; in the step S03, a spin coating process is used to deposit the insulating sheet-shaped two-dimensional material solution on the solid dielectric and the trench, and heat, thereby a thin film composed of the insulating sheet-like two-dimensional material is formed on the solid dielectric and the trench.

the step S02 further comprises: dissolving the insulating sheet-like two-dimensional material in water and adding an organic solvent to prepare the insulating sheet-like two-dimensional material solution; in the step S03, a spin coating process is used to deposit the insulating sheet-shaped two-dimensional material solution on the solid dielectric and the trench and heat; the step of the immersion thin film-forming process is: immersing the solid dielectric in the insulating sheet-shaped two-dimensional material solution, and the heating causes the solvent to evaporate, thereby forming a thin film composed of an insulating sheet-like two-dimensional material on the solid dielectric and the trench.

Further, in the immersion thin film forming process, a clamping part is located at the edge of the upper surface of the solid dielectric, and the clamping part is kept at a distance from the edge of the upper surface of the solid dielectric; wherein the surface tension of the insulating sheet-shaped two-dimensional material solution and the material of the solid dielectric and the clamping part are adjusted so that the surface tension of the insulating sheet-shaped two-dimensional material solution is greater than the force between the insulating sheet-shaped two-dimensional material solution and the solid dielectric, and is greater than the force between the insulating sheet-shaped two-dimensional material solution and the clamping part; the contact angles between the insulating sheet-shaped two-dimensional material solution and the solid dielectric is greater than 60°, the contact angles between the insulating sheet-shaped two-dimensional material and the clamping part is greater than 60°, so that the insulating sheet-shaped two-dimensional material solution cannot pass through the distance to enter the edge of the upper surface of the solid dielectric, the sidewall of the solid dielectric, and the bottom of the solid dielectric.

Further, wherein in the immersion thin film forming process, the clamping part is used to cover the bottom, the sidewall and upper surface edge of the solid dielectric.

Further, the insulating sheet-shaped two-dimensional material is graphene oxide, boron nitride, or $Si_2BN$.

Further, the size value of the insulating sheet layer is in a normal distribution, and the center value of the normal distribution is greater than 1.2 times the size of the trench.

Further, the process for preparing the graphene oxide solution comprises following steps:
  S01: dissolving graphene oxide in water, then adding an organic solvent and dissolving the graphene oxide ultrasonically at 55-65° C. to form a stable graphene oxide solution;
  S02: filtering the graphene oxide solution by a filter membrane with size of M1, and the remaining part after the filtration is the graphene oxide solution after the first filtration; wherein M1 is the size of the trench;

S03: filtering the graphene oxide solution by a filter membrane with size of M2, and the filtered part is the graphene oxide solution after the second filtration; wherein M2 is greater than M1.

Further, the size value of the insulating sheet layer is in a normal distribution, and the center value of the normal distribution is greater than 1.2 times the size of the trench An intermetallic air gap, comprises: a solid dielectric and a trench located in the solid dielectric, the upper surface of the solid dielectric and the trench is covered with a thin film composed of an insulating sheet-like two-dimensional material, and the thin film composed of the insulating sheet-like two-dimensional material seals the trench to form an intermetallic air gap; wherein the insulating sheet-like two-dimensional material comprises an insulating nano sheet-like layer, and the smallest dimension of the insulating nano sheet-like layer in the sheet-like two-dimensional direction is larger than the size of the trench.

Further, when the solid dielectric is a metal layer, a dielectric protective layer is comprised between the thin film composed of an insulating sheet-like two-dimensional material and the metal layer, and the sidewall of the trench also comprises a dielectric protection layer.

The beneficial effects of the present disclosure are that: the present disclosure uses an insulating sheet layer with a minimum size larger than the size of the trench in the solid dielectric to seal the trenches, thereby forming an intermetallic air gap. The method of the present disclosure can avoid the sealing thin film to be deposited in the intermetallic air gap in the prior art, the formation ratio of the intermetallic air gap can be effectively increased, thereby greatly reducing the effective dielectric constant and interconnection delay, further reducing costs, and improving product performance. Meanwhile, the surface of the intermetallic air gap formed by the method of the present invention is flat, the flattening effect can be obtained while sealing the intermetallic air gap, so that no subsequent flattening process is required, which simplifies the integration process.

Figure 1:
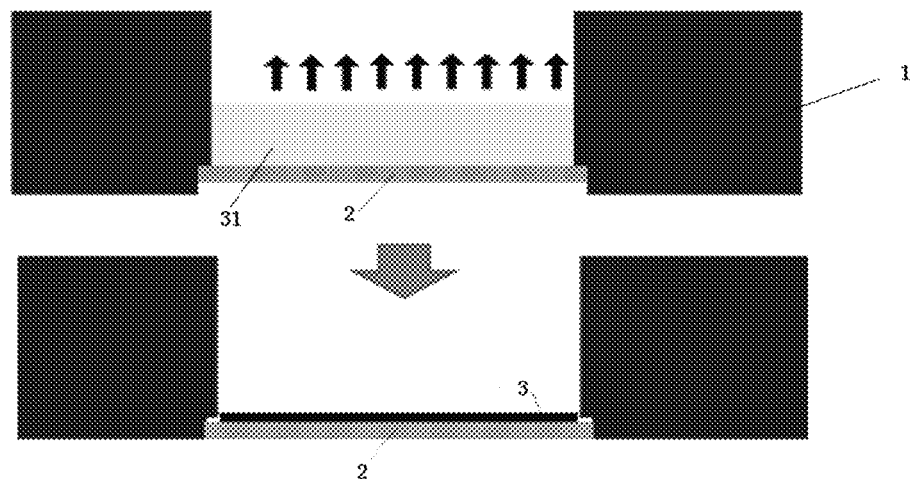
FIG. 1 is a schematic diagram of an immersion thin film formation in Embodiment 1

Wherein:
1 clamping part 2 solid dielectric 3 graphene oxide thin film
31 graphene oxide solution
11 silicon wafer 12 metal layer 13 isolation dielectric layer,
14 dielectric protection layers
15 thin film composed of insulating sheet-like two-dimensional material
16 insulating dielectric layers
17 intermetallic air gaps between metals
18 intermetallic air gaps between insulating dielectric layers

DETAILED DESCRIPTION

To make the objectives, technical solutions, and advantages of the present disclosure clearer, the specific embodiments of the present disclosure will be further described in detail below with reference to the accompanying drawings.

The method for forming an intermetallic air gap provided by the present disclosure comprises following steps:

S01: forming a trench in a solid dielectric. Wherein, the formation position of the intermetallic air gap is determined according to the process requirements, and any method that can form the intermetallic air gap in the prior art can use to form the intermetallic air gap in the present disclosure. The solid dielectric can be a metal wire, or an insulating dielectric located above the metal wire.

S02: preparing an insulating sheet-like two-dimensional material, wherein the insulating sheet-like two-dimensional material comprises an insulating nano sheet-like layer, and the size of all the insulating nano sheet-like layers is larger than the size of the above-mentioned trench. Since the insulating sheet-like two-dimensional material is used to seal the above-mentioned trench for forming an intermetallic air gap, it is necessary to ensure that the minimum size of the insulating sheet layer is greater than the size of the trench during the sealing process. The size refers to the size in the two-dimensional direction, which respectively refers to the size of the insulating sheet layer in the sheet-like two-dimensional direction and the size of the upper surface of the trench, to ensure that the two-dimensional insulating sheet material can cover the solid dielectric above the trench instead of falling into the trench.

S03: deposit the insulating sheet-like two-dimensional material on the solid dielectric and the trench. The minimum size of the insulating sheet layer is larger than the size of the trench. Therefore, the insulating sheet two-dimensional material can cover the solid dielectric on both sides of the trench and on the top of the trench, which is used to seal the trench and form an intermetallic air gap. The insulating sheet-shaped two-dimensional material covering the solid dielectric can be used as an insulating isolation layer. When the solid dielectric is a metal, the insulating sheet-shaped two-dimensional material can be used to isolate adjacent upper and lower layers of metal. In the specific process, the insulating sheet-shaped two-dimensional material can be placed on the solid dielectric and the trench in any technical means.

S04: annealing the solid dielectric and the insulating sheet-shaped two-dimensional material, to form a stable thin film composed of the insulating sheet-shaped two-dimensional material on the trench. The sample with the deposited thin film is annealed in the annealing equipment and in an oxygen environment, the temperature is less than or equal to 450° C., and the annealing time is 10 min-60 min. The high-temperature annealing in the step is to break the unstable dangling bonds and groups in the insulating sheet-like two-dimensional material, to prevent these groups from adsorbing other gas in the atmospheres in the environment, resulting in changes in the characteristics of the thin film composed of the insulating sheet-shaped two-dimensional material, a stable insulating sheet-like two-dimensional material thin film is formed on the trench after annealing.

In the present disclosure, the graphene oxide is preferable for preparing the insulating sheet-shaped two-dimensional material, and it can also be boron nitride or Si2BN. The preparation method of the graphene oxide can adopt the preparation method in the prior art, such as using strong oxidizing agent (potassium permanganate, concentrated sulfuric acid, phosphoric acid, etc.) to oxidize the graphite and intercalate to separate the graphene oxide layer. The graphene layer is a sheet-like two-dimensional structure.

Wherein, the preparation method of the graphene oxide solution is:

S01: dissolving graphene oxide in water, adding an organic solvent. The organic solvent can be IPA, ethylene glycol, etc. Dissolving the graphene oxide ultrasonically at 55-65° C. to form a stable graphene oxide solution.

S02: filtering the graphene oxide solution by a filter membrane with size of M1, and the remaining part after the filtration is the graphene oxide solution after the first filtration; where M1 is the size of the trench to be sealed in the present disclosure;

S03: filtering the graphene oxide solution by a filter membrane with size of M2, and the filtered part is the graphene oxide solution after the second filtration; wherein M2 is greater than M1. Through two filtrations, the minimum size of the graphene oxide layer in the graphene oxide solution is larger than the size of the intermetallic air gap to be sealed, and the size value of the graphene oxide layer is in a normal distribution, and the center value of the normal distribution is 1.2 times greater than the size of the trench to be sealed, and the surface tension of the graphene oxide solution is adjusted to be greater than 20 mN/m, and the viscosity is greater than 3 mPa·s.

An intermetallic air gap prepared by the present disclosure includes a solid dielectric and a trench located in the solid dielectric. The upper surface of the solid dielectric and the trench is covered with a thin film composed of an insulating sheet-shaped two-dimensional material, and the trench is sealed to form an intermetallic air gap by the thin films composed of an insulating sheet-shaped two-dimensional material; wherein the thin film composed of the insulating sheet-like two-dimensional material comprises an insulating sheet-like two-dimensional material which multiple insulating nano sheet-like layers be comprised in, and the minimum size of the insulating sheet layer is greater than the size of the trench. When the solid dielectric is a metal layer, the inner sidewall of the trench is covered with a dielectric protection layer, and the dielectric protection layer is located between the thin film composed of insulating sheet-like two-dimensional material and the metal layer. The dielectric protection layer here is used to protect the metal layer from being damaged by the insulating sheet-shaped two-dimensional material, and to avoid the possible leakage phenomenon between the metal layer and the insulating sheet-shaped two-dimensional material.

The process of coating the prepared graphene oxide solution on the solid dielectric and the trench is described in detail in the following Embodiment 1:

Embodiment 1

The process of sealing the intermetallic air gap to be sealed by the insulating sheet-like two-dimensional material solution can be carried out in the following two means:

The first mean is to use multiple spin-coating method, that is, the graphene oxide solution is spin-coated on the solid dielectric on both sides of the trench multiple times, and a hot plate is used quickly drying after each spin-coating. A thin film composed of graphene oxide is formed above the trench, and the solvent in the thin film is removed by heat treatment for a long time (for example, 30 minutes) after multiple spin coatings. In this way, the thin film composed of graphene oxide becomes more stable; and then the trench will be sealed to form an intermetallic air gap.

Figure 5:
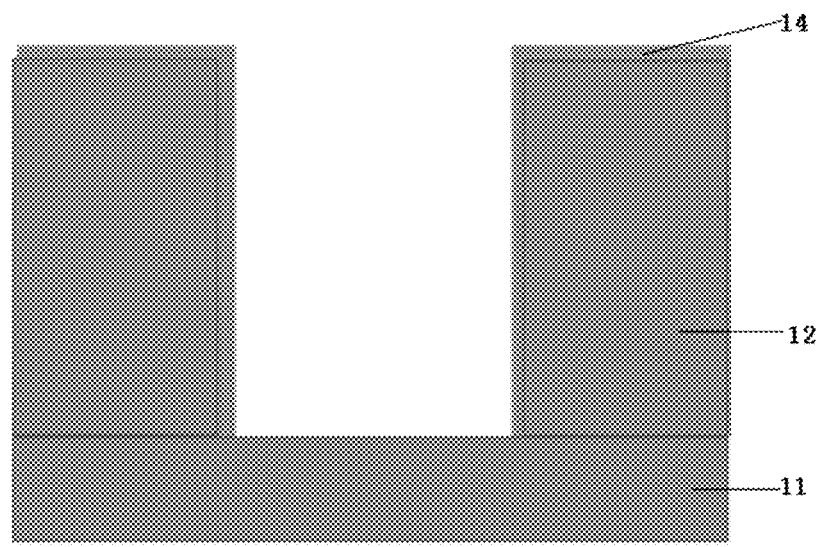
FIG. 5 is a schematic diagram of the dielectric protection layer deposited in Embodiment 2
Figure 6:
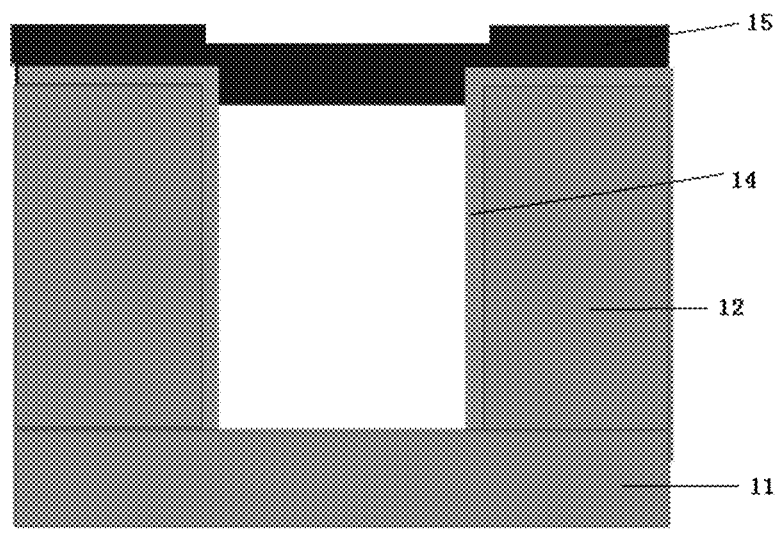
FIG. 6 is a schematic diagram of an intermetallic air gap formed between metals in Embodiment 2
Figure 7:
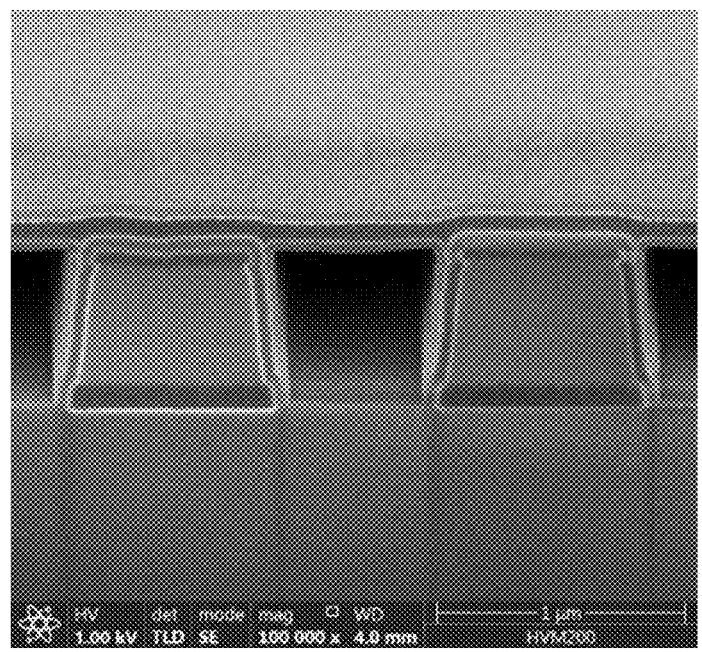
FIG. 7 is an SEM schematic diagram of an intermetallic air gap formed between metals in Embodiment 2

The second mean is to use the immersion thin film forming method, that is, the solid dielectric with the trench is immersed in the graphene oxide solution, and the solvent is evaporated by slow heating, a thin film composed of graphene oxide is formed on the upper surface of the trench and the solid dielectric on both sides, which seals the trench and forms an intermetallic air gap. The specific steps are as following: putting the solid dielectric with trenches into a container, such as a petri dish, etc., using a graduated cylinder to measure a certain volume of the stable graphene oxide solution, slowly pouring it into the container, and placing the container on the heating plate, wherein the heating plate is set to a temperature of 40-80° C. to slowly evaporate the solvent in the stable graphene oxide solution. Due to the low solubility of the graphene oxide, the graphene oxide will chromatograph out and slowly precipitate onto the upper surface of the solid dielectric. The heating temperature here should not be too high to prevent the precipitate from being subjected to violent molecular movement in the graphene oxide solution, thereby agglomerating to form large particles. Using the above-mentioned immersion thin film forming method, the number of graphene oxide layers above the sample is fixed, the thickness of the thin film composed of graphene oxide is also fixed after slow evaporation, and the thickness of graphene oxide is relatively uniform. Here, the thickness of the thin film composed of graphene oxide finally formed can also be controlled by controlling the volume of the graphene oxide solution. Please refer to FIG. 6, after the immersion thin film forming method is used to form a thin film composed of graphene oxide on the trench, the film composed of graphene oxide on the trench is embedded in the trench compared to the film composed of graphene oxide on the surrounding solid dielectric, please also refer to FIG. 5 and FIG. 7 for details. With reference to FIG. 5-FIG. 7, the surface of the thin film composed of graphene oxide is very flat. Therefore, after sealing with a film composed of graphene oxide, the CMP process in the prior art can be omitted, which greatly simplifies the intermetallic air gap formation process. At the same time, it can also be seen that the thin film composed of graphene oxide can seal the trench and ensure the performance of the intermetallic air gap, which also greatly saves the raw materials in the intermetallic air gap formation process.

It is worth noting that because the graphene oxide solution exists in a stable solution form, that is, a single graphene oxide layer is uniformly dispersed in the solution. When the graphene oxide solution is poured into the container, the graphene oxide layer in the graphene oxide solution exists individually. Since the size of the single graphene oxide layer is larger than the size of the trench, when one of the graphene oxide layers sealed the trench, the rest of the graphene oxide layers will no longer enter the trench. This is also the reason why there is little or almost no graphene oxide at the bottom of the trench in the present disclosure, as shown in FIG. 6.

Figure 2:
FIG. 2 is a schematic diagram of the state corresponding to different contact angles between liquid and solid
Figure 3:
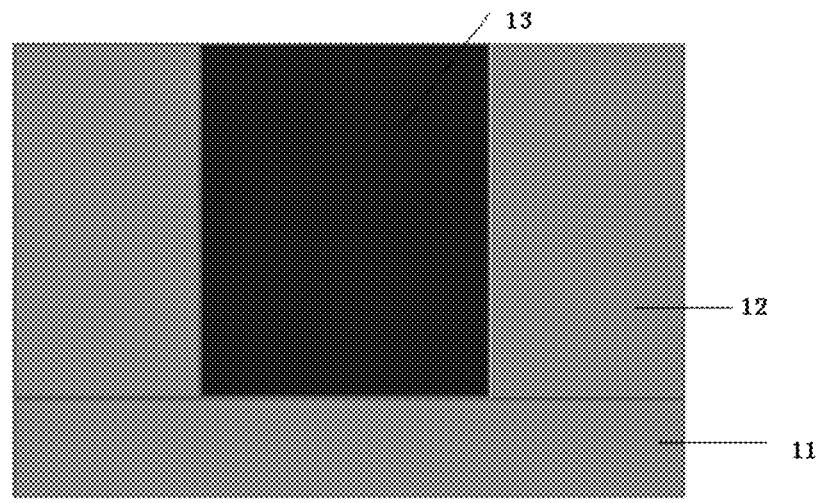
FIG. 3 is a schematic diagram of the simultaneous deposition of a metal layer and a dielectric layer on a silicon wafer in Embodiment 2
Figure 4:
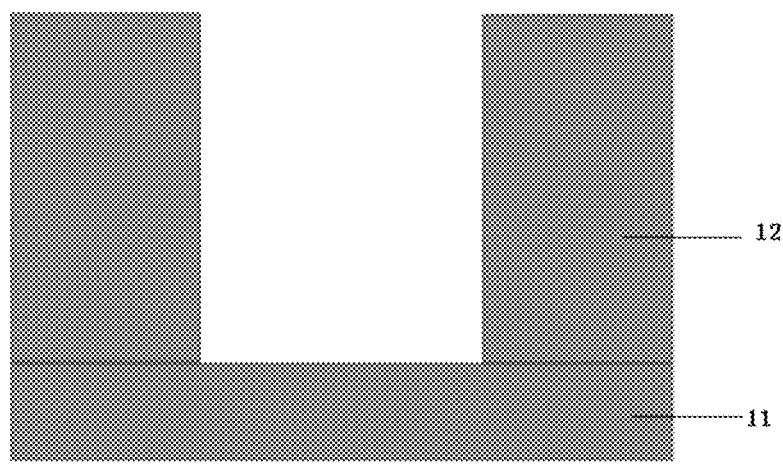
FIG. 4 is a schematic diagram of removing the dielectric layer in Embodiment 2

It is worth noting that in the immersion thin film forming method, in order to prevent the solid dielectric from being immersed in the solution, causing the back of the solid dielectric to contact the solution and affecting the subsequent process; it is necessary to ensure that the graphene oxide solution does not touch the sidewalls and bottom of the sample in the immersion thin film forming process in order to protect the sidewall and bottom of the sample. Specifically, the following methods can be used: (1) a clamping part is provided above the edge of the upper surface of the solid dielectric, and the clamping part is kept at a certain distance from the edge of the upper surface of the solid dielectric, and the distance is small enough (specifically, the clamping part can be designed as a liftable mode to adjust the specific distance). Please refer to FIG. 2, FIG. 2 is a schematic diagram of the state corresponding to different contact angles between liquid and solid. From left to right, the presents the ideal conditions of unfolding, partial infiltration, beginning to repel water, best water repellency, and complete water repellency. If the contact angle is less than a certain angle, that is, the liquid and the solid are infiltrated, the liquid will spread, such as 0° in FIG. 2; when the contact angle between the liquid and the clamping part is greater than a certain angle (such as 60°), the liquid will not be spread out; the present disclosure hopes that there will be no infiltration effect between the liquid, the clamp and the solid dielectric. As shown in FIG. 2, by adjusting the surface tension of the insulating sheet-shaped two-dimensional material, the material of the solid dielectric and the material of the clamping part, the surface tension of the insulating sheet-shaped two-dimensional material solution is greater than the force between the insulating sheet-shaped two-dimensional material solution and the solid dielectric, and the force between the insulating sheet-shaped two-dimensional material solution and the clamping part, so that the contact angle between the insulating sheet-mounted two-dimensional material solution and the solid dielectric, and the contact angle between the insulating sheet-shaped two-dimensional material solution and the clamping part, are both greater than 60°. And a reasonable distance between the clamping part and the upper surface of the solid dielectric is set, so that the insulating sheet-like two-dimensional material will not enter the edge of the upper surface of the solid dielectric, the sidewall of the solid dielectric, and the bottom of the solid dielectric. The bottom here is relative to the edge of the upper surface of the solid dielectric. As mentioned above, the contact angle between the insulating sheet-shaped two-dimensional material solution and the solid dielectric, and the contact angle between the insulating sheet-shaped two-dimensional material solution and the clamping part, can be determined by adjusting the insulating sheet-shaped two-dimensional material solution and selecting a suitable solid dielectric and clamping part. For example, the surface tension of the insulating sheet-shaped two-dimensional material solution can be reduced by adding a macromolecular solvent to the solution, or by replacing the material of solid dielectric and the material of the clamping part. The surface tension of the insulating sheet-shaped two-dimensional material solution can be greater than the surface tension between the material it contacts and the insulating sheet two-dimensional material solution, as a result, the phenomenon of non-wetting occurs, so that when the clamping part and the solid dielectric are not in contact and there is a slit, the insulating sheet-shaped two-dimensional material solution will not spread out and drill in along the slit. This method in which the clamping part and the upper surface of the solid dielectric are not in contact can prevent the upper surface of the solid dielectric from being damaged. In addition to the above-mentioned setting method, the clamping part can also be arranged on the sidewall of the solid dielectric, that is, the clamping part is kept at a certain distance from the sidewall of the solid dielectric, so that the insulating sheet-like two-dimensional material solution cannot enter the sidewall of the solid dielectric and the bottom of the solid dielectric through the distance. (2) Using the above-mentioned principle of surface tension, the upper surface edge of the solid dielectric and the corresponding position of the upper surface edge can also be etched into nanostructures, and the surface tension of the solution is used to form a larger surface tension at the nanostructures to prevent the liquid from further enter the edge of the upper surface of the solid dielectric, where the upper surface edge is the part that keeps a certain distance from the clamping part. (3) using the clamping part to clamp and cover the upper surface edge, the bottom, and the sidewall of the solid dielectric to ensure that the insulating sheet-like two-dimensional material solution will not enter the upper surface edge, the sidewall, and the bottom of the solid dielectric. Since the chip on the edge of the upper surface of the solid dielectric has no functional area in the subsequent, the coverage here will not affect the normal performance of the solid dielectric. As shown in FIG. 1, the edge position of the upper surface of the solid dielectric can be covered by the clamping parts. (4) before the immersion thin film formation, a sacrificial layer, such as silicon oxide, can also be grown on the lower surface and sidewall of the solid dielectric. After the immersion thin film formation process is completed, the sacrificial layer on the back and sidewall is etched to remove. Wherein, the above-mentioned clamping member is for clamping or covering the surrounding of the solid dielectric. Therefore, the clamping member is ring-shaped, and the specific shape is set according to the shape of the solid dielectric. At the same time, the above-mentioned upper surface edge refers to an area located at a specific distance from the upper surface edge of the solid dielectric. This area usually does not have a functional area. The specific distance is determined according to the size of the device formed by the solid dielectric.

Embodiment 2

Please refer to FIG. 3-6, the specific method of forming the intermetallic air gap includes following steps:

S01: Please refer to FIG. 3, a metal layer 12 and an isolation dielectric layer 13 are simultaneously deposited on a silicon wafer 11, and the isolation dielectric layer 13 and the metal layer 12 have a high selectivity etch coefficient.

S02: Please refer to FIG. 4, the isolation dielectric layer 13 is removed by a dielectric etching process. Since the metal layer 12 and the isolation dielectric layer 13 have a high selectivity ratio, the metal layer 12 remains basically unchanged, thereby forming a trench between the metal layers.

S03: Please refer to FIG. 5, a dielectric protection layer 14 is deposited on the upper surface and sidewall of the metal layer 12; the function of the dielectric protection layer 14 is to protect the metal layer 12 from being damaged by the subsequent insulating sheet-shaped two-dimensional material solution.

S04: Please refer to FIG. 6, coating the insulating sheet-like two-dimensional material solution on the metal layer to form a thin film 15 composed of the insulating sheet-like two-dimensional material on the trench, thereby forming an intermetallic air gap sealed by a thin film composed of the insulating sheet-like two-dimensional material. The specific method for coating the insulating sheet-shaped two-dimensional material is as described in Embodiment 1.

In addition, the following methods can also be used to form the intermetallic air gap: depositing a sacrificial layer on the silicon wafer, forming a metal interconnection in the sacrificial layer, and then releasing the sacrificial layer to form a trench between the metals, and then using the above steps S03-S04 to form the intermetallic air gap.

The SEM image of the intermetallic air gap formed by the method of the present disclosure is shown in FIG. 7, there is basically no filler on the bottom of the intermetallic air gap, which greatly increases the formation ratio of the intermetallic air gap. In the present disclosure, even in the process of coating the insulating sheet-like two-dimensional material solution, one end of some of the insulating nano sheet-like layers is located on the metal, and the other end is hanging in the intermetallic air gap, and the insulating nano sheet-like layer falling into the trench is also close to the sidewall of the intermetallic air gap, it will not be deposited on the bottom surface of the intermetallic air gap. In addition, the minimum size of the insulating sheet layer is larger than the size of the trench to be sealed, and the number of the insulating sheet layer close to the sidewall of the trench is not large, as shown in FIG. 7.

Embodiment 3

Figure 8:
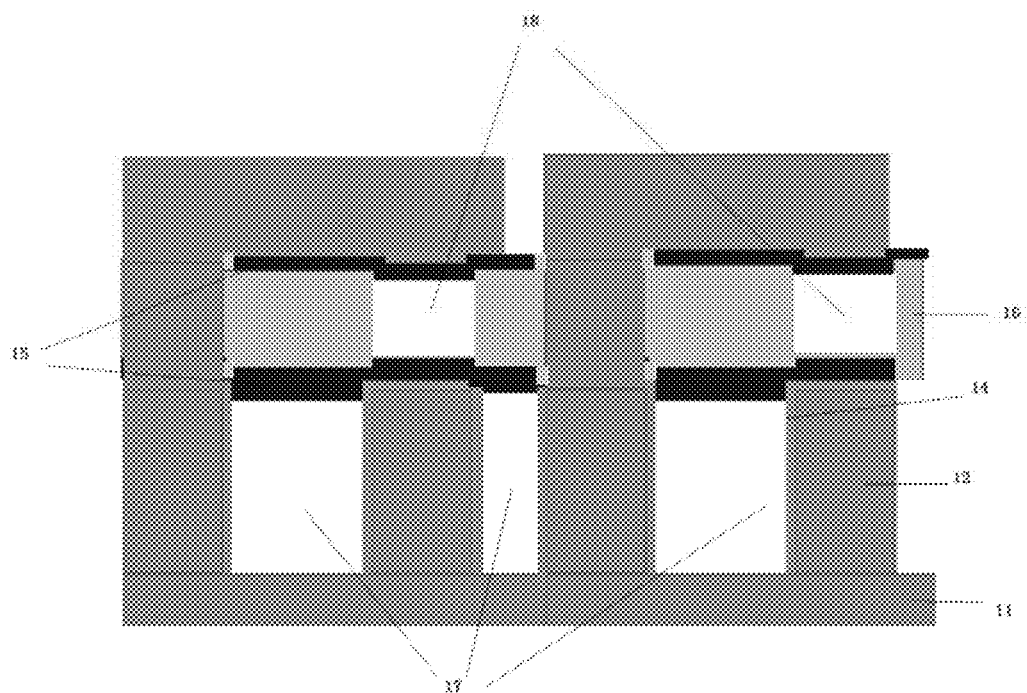
FIG. 8 is a schematic diagram of an intermetallic air gap formed between insulating dielectric layers in Embodiment 3

Referring to FIG. 8, the specific method for forming the intermetallic air gap between insulating dielectric layers is that: after forming the intermetallic air gap 17 in Embodiment 2, an insulating dielectric layer 16 is deposited on the thin film composed of the insulating sheet-like two-dimensional material. The insulating dielectric layer is etched at the staggered position of the intermetallic air gap 17 and stopped on the thin film composed of the insulating sheet-like two-dimensional material to form the trench between the insulating dielectric layers, and the insulating sheet-like two-dimensional material is coated on the insulating dielectric layer. The material solution forms a thin film composed of an insulating sheet-shaped two-dimensional material located on the trench, thereby forming an intermetallic air gap 18 between insulating dielectric layers sealed with an insulating sheet-shaped two-dimensional material. The specific method for coating the insulating sheet-shaped two-dimensional material is as described in Embodiment 1. In the process of preparing the intermetallic air gap 18 between the insulating dielectric layers, to avoid possible leakage, it is necessary to provide a dielectric protective layer in the contact part of the metal layer and the thin film composed of graphene oxide.

In embodiments of the present disclosure, an insulating sheet layer with a minimum size larger than the size of the trench in the solid dielectric is used to seal the trench to form an intermetallic air gap. The method can avoid depositing the sealing thin film in the intermetallic air gap in the prior art, and can effectively improve the intermetallic air gap formation ratio, thereby greatly reducing the effective dielectric constant and interconnection delay, further reducing costs, and improving product performance. Meanwhile, the intermetallic air gap formed by the method of the present disclosure has a flat surface, which can be flattened while sealing the intermetallic air gap, thereby simplifying the integration process without the need for subsequent planarization process.

It will be appreciated that the disclosure is not limited to the exact construction that has been described above and illustrated in the accompanying drawings, and that various modifications and changes can be made without departing from the scope thereof. It is intended that the scope of the disclosure only be limited by the appended claims.

What is claimed is:

1. A method for forming an intermetallic air gap, comprising:
    S01: forming a trench in a solid dielectric;
    S02: preparing an insulating sheet-like two-dimensional material, wherein the insulating sheet-like two-dimensional material comprises an insulating nano sheet-like layer, and the size of the insulating nano sheet-like layer in the sheet-like two-dimensional direction is larger than the size of the trench;
    S03: depositing the insulating sheet-shaped two-dimensional material on the solid dielectric and the trench;
    S04: annealing the solid dielectric and the insulating sheet-like two-dimensional material to form a stable insulating sheet-like two-dimensional material thin film, thereby forming an intermetallic air gap sealed by the insulating sheet-like two-dimensional material thin film.

2. The method for forming an intermetallic air gap of claim 1, wherein the step S02 further comprises: dissolving the insulating sheet-like two-dimensional material in water and adding an organic solvent to prepare an insulating sheet-shaped two-dimensional material solution; in the step S03, a spin coating process is used to deposit the insulating sheet-shaped two-dimensional material solution on the solid dielectric and the trench, and heat, thereby a thin film composed of the insulating sheet-like two-dimensional material is formed on the solid dielectric and the trench.

3. The method for forming an intermetallic air gap of claim 1, wherein the step S02 further comprises: dissolving the insulating sheet-like two-dimensional material in water and adding an organic solvent to prepare the insulating sheet-like two-dimensional material solution; in the step S03, an immersion thin film-forming process is used to deposit the insulating sheet-shaped two-dimensional material on the solid dielectric and the trench; the step of the immersion thin film-forming process is: immersing the solid dielectric in the insulating sheet-shaped two-dimensional material solution, and the heating causes the solvent to evaporate, thereby forming a thin film composed of an insulating sheet-like two-dimensional material on the solid dielectric and the trench.

4. The method for forming an intermetallic air gap of claim 3, wherein in the immersion thin film forming process, a clamping part is located at the edge of the upper surface of the solid dielectric, and the clamping part is kept at a distance from the edge of the upper surface of the solid dielectric; wherein the surface tension of the insulating sheet-shaped two-dimensional material solution and the material of the solid dielectric and the clamping part are adjusted so that the surface tension of the insulating sheet-shaped two-dimensional material solution is greater than the force between the insulating sheet-shaped two-dimensional material solution and the solid dielectric, and is greater than the force between the insulating sheet-shaped two-dimensional material solution and the clamping part; the contact angles between the insulating sheet-shaped two-dimensional material solution and the solid dielectric is greater than 60°, the contact angles between the insulating sheet-shaped two-dimensional material solution and the clamping part is greater than 60°, so that the insulating sheet-shaped two-dimensional material solution cannot pass through the distance to enter the edge of the upper surface of the solid dielectric, the sidewall of the solid dielectric, and the bottom of the solid dielectric.

5. The method for forming an intermetallic air gap of claim 3, wherein in the immersion thin film forming process, the clamping part is used to cover the bottom, the sidewall and upper surface edge of the solid dielectric.

6. The method for forming an intermetallic air gap of claim 1, wherein the insulating sheet-shaped two-dimensional material is graphene oxide, boron nitride, or $Si_2BN$.

7. The method for forming an intermetallic air gap of claim 6, wherein the process for preparing the graphene oxide solution comprises following steps:
   S01: dissolving graphene oxide in water, then adding an organic solvent and dissolving the graphene oxide ultrasonically at 55-65° C. to form a stable graphene oxide solution;
   S02: filtering the graphene oxide solution by a filter membrane with size of M1, and the remaining part after the filtration is the graphene oxide solution after the first filtration; wherein M1 is the size of the trench;
   S03: filtering the graphene oxide solution by a filter membrane with size of M2, and the filtered part is the graphene oxide solution after the second filtration; wherein M2 is greater than M1.

8. The method for forming an intermetallic air gap of claim 1, wherein the size value of the insulating sheet layer is in a normal distribution, and the center value of the normal distribution is greater than 1.2 times the size of the trench.

9. An intermetallic air gap, comprises:
   a solid dielectric and a trench located in the solid dielectric, the upper surface of the solid dielectric and the trench is covered with a thin film composed of an insulating sheet-like two-dimensional material, and the thin film composed of the insulating sheet-like two-dimensional material seals the trench to form an intermetallic air gap; wherein the insulating sheet-like two-dimensional material comprises an insulating nano sheet-like layer, and the smallest dimension of the insulating nano sheet-like layer in the sheet-like two-dimensional direction is larger than the size of the trench.

10. An intermetallic air gap of claim 9, wherein when the solid dielectric is a metal layer, a dielectric protective layer is comprised between the thin film composed of an insulating sheet-like two-dimensional material and the metal layer, and the sidewall of the trench also comprises a dielectric protection layer.

* * * * *